United States Patent [19]

Andrews et al.

[11] Patent Number: 4,836,327

[45] Date of Patent: Jun. 6, 1989

[54] SOUND REINFORCEMENT ENCLOSURE EMPLOYING CONE LOUDSPEAKER WITH ANNULAR CENTRAL LOADING MEMBER AND COAXIALLY MOUNTED COMPRESSION DRIVER

[75] Inventors: Anthony J. Andrews, Capel; Toby C. Hunt, Rusper; John Newsham, London, all of England

[73] Assignee: Turbosound Limited, England

[21] Appl. No.: 929,987

[22] Filed: Nov. 12, 1986

[51] Int. Cl.⁴ .......... H05K 5/00

[52] U.S. Cl. .......... 181/152; 181/145; 181/154; 181/155; 181/159; 181/187; 181/192; 381/156; 381/201

[58] Field of Search .......... 181/145, 150, 154, 155, 181/156, 148, 146, 152, 153, 159, 187–192; 381/156, 201

[56] References Cited

U.S. PATENT DOCUMENTS

| | | | |
|---|---|---|---|
| Re. 32,183 | 6/1986 | Isaacs | 181/185 |
| 2,167,625 | 8/1939 | Albano | 181/156 |
| 2,295,527 | 9/1942 | Bowley | 381/156 |
| 2,907,837 | 10/1959 | Brami | 381/156 |
| 3,852,529 | 12/1974 | Schaffst | 181/159 X |
| 3,972,385 | 8/1976 | Hino et al. | 181/192 |
| 4,040,503 | 8/1977 | Hino et al. | 181/192 |
| 4,064,966 | 12/1977 | Burton | 181/155 X |
| 4,152,552 | 5/1979 | Meyer | 181/159 X |
| 4,215,761 | 8/1980 | Andrews | 181/160 |

OTHER PUBLICATIONS

Yamaha White Paper, Oct. 1981, by Gary Davis & Assocs. Acoustical Engineering, by H. F. Olson, 1940, pp. 212-245.

*Primary Examiner*—Benjamin R. Fuller
*Attorney, Agent, or Firm*—Kenyon & Kenyon

[57] ABSTRACT

An improved sound reinforcement enclosure is disclosed which incorporates a cone-type loudspeaker operating into a generally cylindrical channel extending from the perimeter of the cone to free air. A central member is coaxially mounted within this channel, the central member having rear surfaces substantially parallel to the surface of the cone and external surfaces which, with the internal surfaces of the channel form an annular region, the central member also having at least one coaxial internal passage forming a concentric horn flare. Methods of coaxially mounting a high-frequency compression driver behind the magnet assembly of the loudpseaker and of mounting a second loudspeaker internally in an enclosure are also disclosed.

12 Claims, 4 Drawing Sheets

SOUND REINFORCEMENT ENCLOSURE EMPLOYING CONE LOUDSPEAKER WITH ANNULAR CENTRAL LOADING MEMBER AND COAXIALLY MOUNTED COMPRESSION DRIVER

This application relates to sound reinforcement equipment and, more specifically, to improved design techniques for full-range enclosures.

BACKGROUND OF THE INVENTION

Many sound reinforcement applications require the accurate reproduction of live or recorded program material that has a wide frequency range, typically 40–18,000 Hz. Yet no single transducer practical for use in the art is capable of both accurately and efficiently reproducing this range of frequencies at high power levels. As a result, virtually all sound reinforcement systems, divide the program material into at least two separate frequency bands and provide a separate transducer subsystem for each band, optimized for the reproduction of its range of frequencies, the transducers preferably mounted in a common enclosure.

One such application is "stage monitoring" or "foldback".

A typical musical performance may include as many as fifty separate sound sources (both acoustic and electronic) onstage. While a sound reinforcement system is used to amplify and to adjust their relative levels for the audience, as many as eight essentially separate sound reinforcement systems are required to amplify and adjust their levels for the musicians onstage.

For a musician to maintain the correct vocal and/or instrumental pitch, timbre and tone, he must be able to hear himself. For him to maintain the correct musical relationship with the balance of the ensemble he must be able to hear them. In popular concerts, without a monitoring system, this is frequently difficult or impossible.

One reason is the disparity between various sources in acoustic energy; amplified instruments (such as electric guitars and keyboards) and even unamplified drums and brass will overwhelm nearby voices and acoustic instruments. A second reason is the wide distribution of these sources about the stage, which may place a source important for a musician to hear at a considerable distance from him. Third, only a fraction of the available sources may be relevant to any given musician.

A monitoring system is therefore required to amplify selectively for the musician those relevant sound sources whose location and/or limited acoustic energy would otherwise render them inaudible. Monitoring is also required to overcome distracting time-delayed reflections and reverberation from the auditorium. And, particularly in television, film, and theatrical productions, it may also be necessary for the performer to synchronize his actions with a prerecorded soundtrack.

There has, therefore, long been a demand for specialized sound reinforcement equipment for monitoring purposes, and particularly for suitable sound reinforcement enclosures both of minimal size and capable of generating the required high sound pressure levels.

Monitor enclosures of this type typically employ two 15" diameter cone-type loudspeakers (such as the JBL 2220) in an infinite-baffle or ported arrangement for frequencies below 1200–1600Hz, in combination with a horn-loaded compression driver (such as the JBL 2445J with 2385A) for frequencies above 1200–1600Hz. This produces an enclosure having a large frontal area and therefore consuming considerable floor space, which limits the locations on a crowded stage in which the monitor will fit; reduces the floor area available to the musician; and produces a less than desirable stage picture.

Despite considerable efforts devoted to the problem, no satisfactory method of reducing the size of monitor enclosures had heretofore been developed. Loudspeakers of smaller diameter have been substituted (for example, two 12" diameter loudspeakers for the 15" units), but only at the cost of low frequency power-handling. Similarly, the combination of a single 12" loudspeaker and a compression driver has been employed, but only at the cost of both power handling and low frequency response which severely limits the usefulness of such a monitor.

Existing monitor designs have other known drawbacks.

It is the object of a monitor enclosure to selectively amplify those sound sources of interest to the performer at whom it is aimed. To the degree that the enclosure radiates sound or "spills" beyond this area, it has a negative impact. This monitor spill will be picked up by additional microphones, muddying both the stage sound and that in the auditorium, as well as lowering the gain threshold at which feedback will occur. By increasing the distracting "noise floor" above which the adjacent musician must hear, monitor spill requires a compensating increase in the volume of his monitor, whose own increased spill initiates further rounds of escalation.

It is therefore a desirable object to control enclosure dispersion as a method of reducing monitor spill. The prior art use of infinite-baffle and ported designs for the cone loudspeakers provides little control over dispersion (as well as limited efficiency). Further, for these reasons, and because of the lack of projection typical of such designs, and the resulting rapid decay in volume with distance, such enclosures are limited to locations close to the subject. Horn-loading of the loudspeakers offers potential improvements in dispersion, efficiency, and projection but would also produce an unacceptable increase in enclosure height.

An additional drawback of prior art enclosures is the physical separation of the low-frequency and high-frequency sources, which, given the proximity of the listener, hampers intelligibility.

It is an object of this invention to disclose improved design techniques for loudspeaker enclosures generally, and for monitoring enclosures in particular, which allow the mounting of conventional components in an enclosure with an unprecedented reduction in both frontal area and total volume, while markedly reducing spill, improving projection, and increasing both efficiency and intelligibility.

SUMMARY OF THE INVENTION

A sound reinforcement enclosure is provided with at least one cone-type loudspeaker operating into a channel extending forwardly towards an outlet to free air.

At least one central member is inserted within the channel and on a common centerline whose rear surface is substantially parallel to the surface of the cone and whose sides, together with those of the channel, produce an annular region having a progressively increasing crosssectional area which couples the volume defined by the cone with the outlet to free air.

At least one coaxial opening in the central member is provided, extending from the volume defined by the shape of the cone to the outlet to free air, and of progressively increasing crosssection.

The resulting apparatus provides a marked improvement in dispersion, efficiency and projection while requiring an increase in enclosure depth which is only a fraction of that required by prior art methods.

By mounting the high-frequency compression driver to the rear of the loudspeaker magnet assembly such that its outlet aligns with the central opening in the latter, and by employing a horn flare which may pass through the center of the loudspeaker voice coil form, the high frequency driver and horn may be mounted coaxially with the loudspeaker, reducing enclosure size and improving intelligibility.

Both the mid-high information which radiates from the region of the loudspeaker cone immediately surrounding the voice coil and the high frequency output of the compression driver and its associated horn couple to the horn flare formed by the passage in the central member.

By mounting a second loudspeaker within the enclosure centered on a common longitudinal plane with the first, and by ducting its output to free air, the width of the enclosure can be halved relative to prior art enclosures with the same components.

DETAILED DESCRIPTION

Refer now to FIGS. 1–5, views of an enclosure adapted for monitoring purposes and employing the improved techniques of the present invention.

Like typical prior art monitor enclosures, the enclosure of FIG.1–5 employs two 15" loudspeakers and one 2" compression driver. Unlike such enclosures, only one 15" driver is visible.

Figure 1:
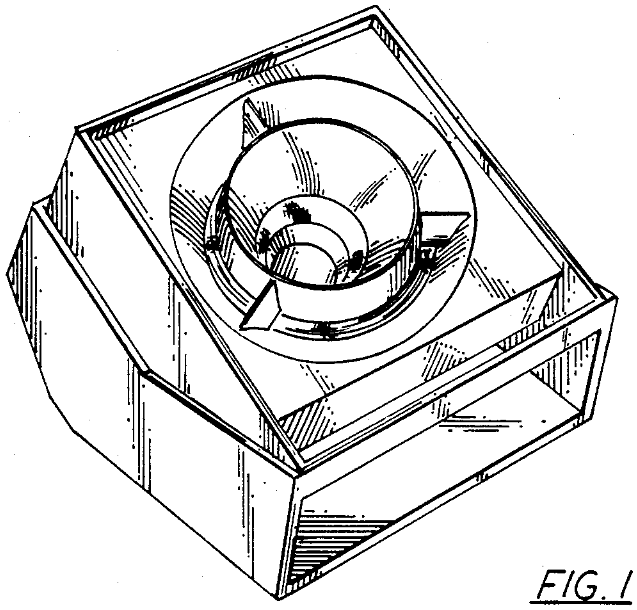
FIG. 1 is a general view of an enclosure employing the improved techiques the present invention.
Figure 2:
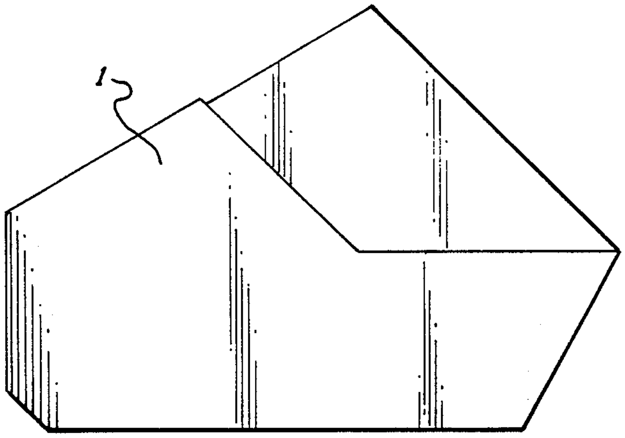
FIG. 2 is a side elevation of the enclosure of FIG.1
Figure 3:
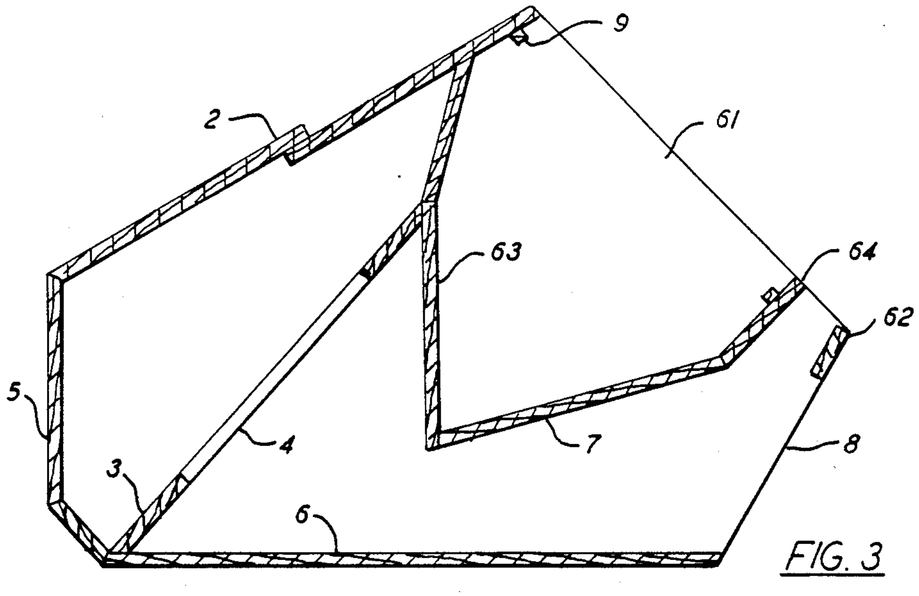
FIG. 3 is a longitudinal section through the enclosure of FIG. 1, with the various drivers removed.

Referring now to FIG.3, it will be apparent that the enclosure comprises a top 2, rear 5, and bottom 6 of appropriate material (typically Baltic birch plywood), together with side 1 of FIG.1 (and a second side not visible in these views). Unlike typical prior art enclosures, internal partitions 3, 7, and 63 of the same material form plural internal compartments.

Figure 5:
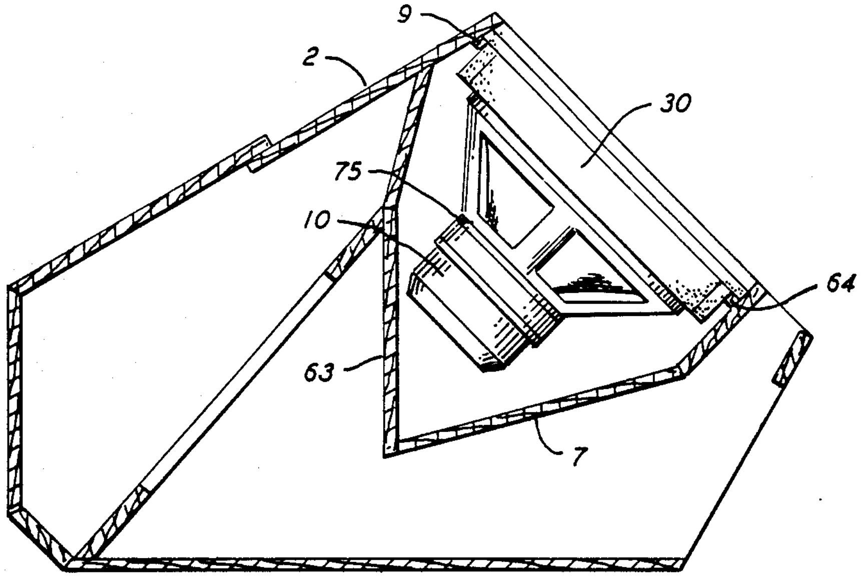
FIG. 5 is a longitudinal section of FIG.3, with the improved of the present invention.

Referring to FIG.5, the visible 15" loudspeaker 75 is mounted to a casing 30, which, in turn, is mechanically attached to the enclosure via brackets 9.

Figure 6:
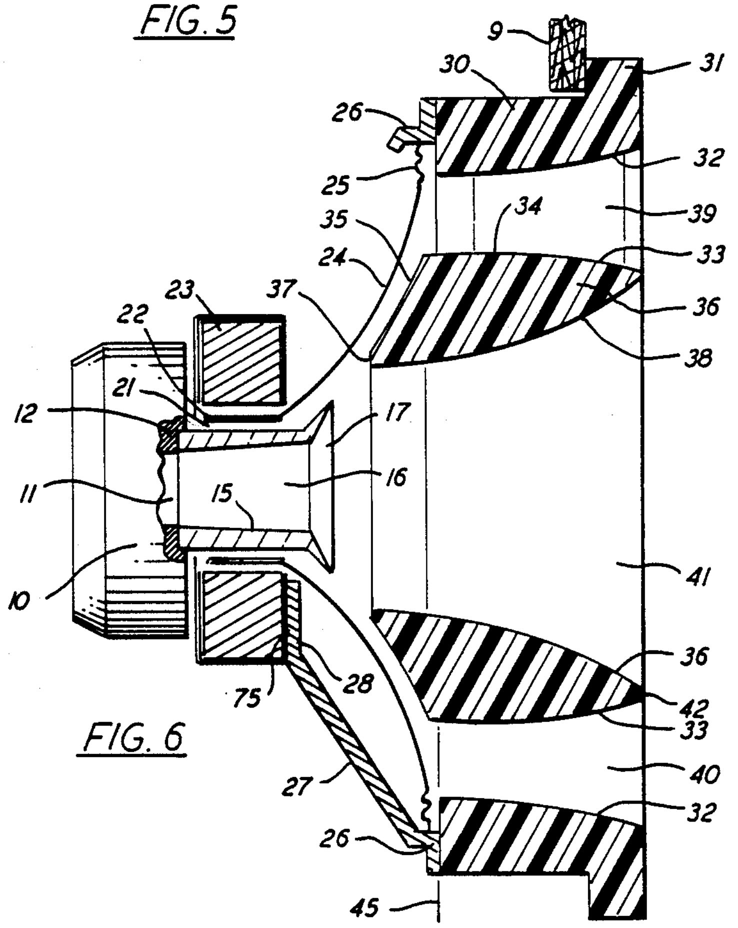
FIG. 6 is a longitudinal section through the improved apparatus of invention, showing the annular central me and coaxial mounting of the high frequency driver.
Figure 7:
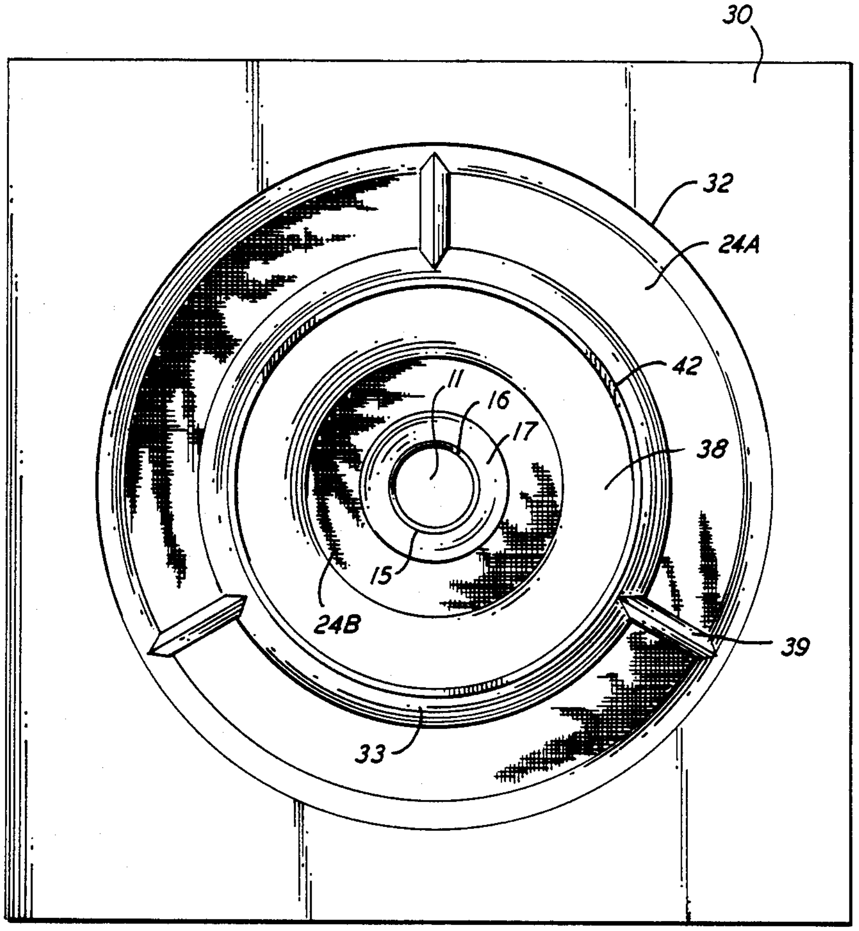
FIG. 7 is a front elevation of FIG. 6.

Referring now to FIG.6, the construction of the improved apparatus of the present invention will be described.

Loudspeaker 75 is a conventional 15" unit such as the Turbosound LS-1503 or other suitable 3" voice coil loudspeaker (although suitable loudspeakers having other voice coil sizes may be employed) comprising a cone 24 of stiff pulp or similar material, attached at its center to a cylindrical voice coil form 22, and at its perimeter to a resilient "surround" 25 of rubber or similar material, in turn attached to a generally circular frame 26. Frame 26, which may be of stamped or cast construction, includes struts 27 which terminate in a circular flange 28 which maintains a magnet assembly 23 at a fixed distance from the plane 45 of the front face of frame 26. Magnet assembly 23 is of circular shape, providing a cylindrical opening in which voice coil form 22 may be driven along the central axis of the loudspeaker by suitable exitation of the coil wrapped around it.

In prior art infinite baffle designs, the frame 26 is bolted in a pass hole of suitable diameter, directly to the front face of the enclosure.

The improved apparatus of the present invention provides an outer casing 30, cast or formed of any suitable material, having a circular opening whose walls 32 define a cylindrical channel extending forward from the perimeter of the loudspeaker cone 24 to free air. Casing 30 is attached to the enclosure by bolting flange 31 to bracket 9, and loudspeaker 75 is bolted to casing 30.

Preferably, the diameter of the opening in casing 30 gradually increases, forming a horn flare.

Within this cylindrical channel or flare, the improved apparatus of the present invention provides a coaxial central member 36, which is preferably mounted by struts 39 of streamlined section, although other mounting methods may be employed.

The exterior surface of central member 36 and the internal surface 32 of casing 30 form an annular region 40 of increasing crossectional area which couples the volume formed by the rear surface 35 of central member 36 and loudspeaker cone 24 with free air.

It be understood in the context of U.S. Pat. No. Re:32,183 that the performance of the central member is a product of the change in crosssectional area produced by the combination of the member itself and the channel in which it is located, and that changes in the profile of either or both may be made.

The rear surface 35 of the central member 36 is generally parallel to that of cone 24. In the illustrated embodiment, the clearance between the cone 24 and the central member 36 at the closest point 37 is approximately ¼", although this distance can be increased.

Preferably, the distance between the central member 36 and cone 24 progressively increases from the smallest diameter of the former at 37 towards the perimeter of the latter.

Preferably, the transition between the rear surface 35 of the central member 36 and its forwardly tapering portion 33 is located in a plane forward of the mounting plane 45 of the loudspeaker.

Preferably, the surfaces of a section 34, that section between the rear surface 35 and forwardly tapering section 33, all of central member 36, are substantially parallel to the adjacent surfaces 32 of casing 30, such that a plain wave tube of constant crossectional area is formed in that area.

A coaxial passage 41 is formed within central member 36.

Preferably, the diameter of this passage 41 progressively increases toward the outlet, forming a second, concentric horn flare.

FIG. 5 and FIG. 6 thus illustrate an annular central member 36 inserted within a generally cylindrical channel extending from the perimeter of a cone loudspeaker 75 to an outlet to free air, the central member having rear surfaces 35 substantially parallel to the surface of loudspeaker cone 24; external surfaces 34 and 33 which, with the internal surfaces 32 of the channel, form an annular region 40; and internal surfaces 38 which form a concentric horn flare 41.

In contradistinction to classical horn-loading theory and experience which require an increase in total path length producing an unacceptable increase in enclosure size, the improved apparatus of FIG.5 and 6 produces marked improvements in efficiency and projection with an increase in overall path length of less than four inches, a small fraction of the requirements for a traditional horn flare. Although approximately one-third the length of the apparatus disclosed in U.S. Pat. No. Re:32,183, the apparatus of FIG. 5 and 6 further provides the same absence of undesirable coloration.

Further, the improved apparatus of the present invention extends the usable frequency response of the 15" loudspeaker by exploiting a particular property of cone loudspeakers. Such loudspeakers behave as true pistons at lower frequencies, with the cone displaced linearly along the central axis of the loudspeaker, but at progressively higher frequencies, sound radiates from progressively smaller regions centered around the voice coil. The concentric horn flare 41 formed by the interior surfaces 38 of annular central member 36 efficiently couples these high frequencies. Accordingly, the inner diameter of the central horn flare 41 exceeds that of the minimum diameter of the cone 24 at the voice coil form 22, such that the inner portion 24B of the cone 24 falls within it.

The improved high frequency response of the loudspeaker allows raising the crossover point between it and the compression driver, allowing an increase in the power-handling ability of the latter.

The apparatus of the present invention brings this unique combination of advantages to any existing conventional loudspeaker with a single component which is simple and inexpensive to fabricate.

It will be understood that additional concentric passages may be formed in central member 36, for example, by the insertion of a solid member in internal horn flare 41, and/or a second annular member can be nested within the first.

Other diaphragm shapes and drivers may be employed.

A second aspect of the invention resides in an improved method of mounting high-frequency compression drivers.

In prior art monitor enclosures, the compression driver and its associated horn flare is located adjacent to the cone loudspeakers. This has the disadvantage of increasing the frontal area of the enclosure. The physical separation of the drivers also hampers intelligibility.

The coaxial mounting of the compression driver forward of cone 24 would serve to mitigate both problems, but at the cost of significantly increasing total enclosure depth.

Referring to FIG.5 it will be seen that the improved apparatus of the present invention mounts the compression driver 10 (here illustrated as a Beyma CP550) immediately behind the magnet assembly 23, with the driver outlet 11 in alignment with the cylindrical opening in magnet 23.

A horn flare 15, here illustrated as an aluminum turning, is fabricated with an external diameter which allows its insertion through the cylindrical volume 21 interior to voice coil form 22, such that movement of the voice coil is not impeded. Flare 15 is illustrated as mounted by means of a threaded exterior portion 12 which engages the threaded opening 11 of driver 10. Flare 15 is also illustrated as having a first portion 11 of progressively increasing crosssection, and a section portion 17 whose crosssection increases at a greater rate.

The illustrated mounting of the compression driver consumes neither additional frontal area nor does it require an increase in the depth of typical enclosures. While classical theory teaches against abrupt changes in cross-sectional area, the abrupt increase at the transition between horn flare 15 and the horn flare formed by the inner surfaces 38 of annular central member 36, which is required to couple high-mid frequencies radiated by the inner portion 24B of cone 24, has not been found to have an unacceptable effect. In fact, the horn flare formed by the inner surfaces 38 of annular central member 36 has been found to improve not only the high-mid frequency performance of the loudspeaker but the performance of the compression driver/horn flare combination as well.

A third aspect of the invention resides in an improved method of mounting a second loudspeaker in the enclosure.

Figure 4:
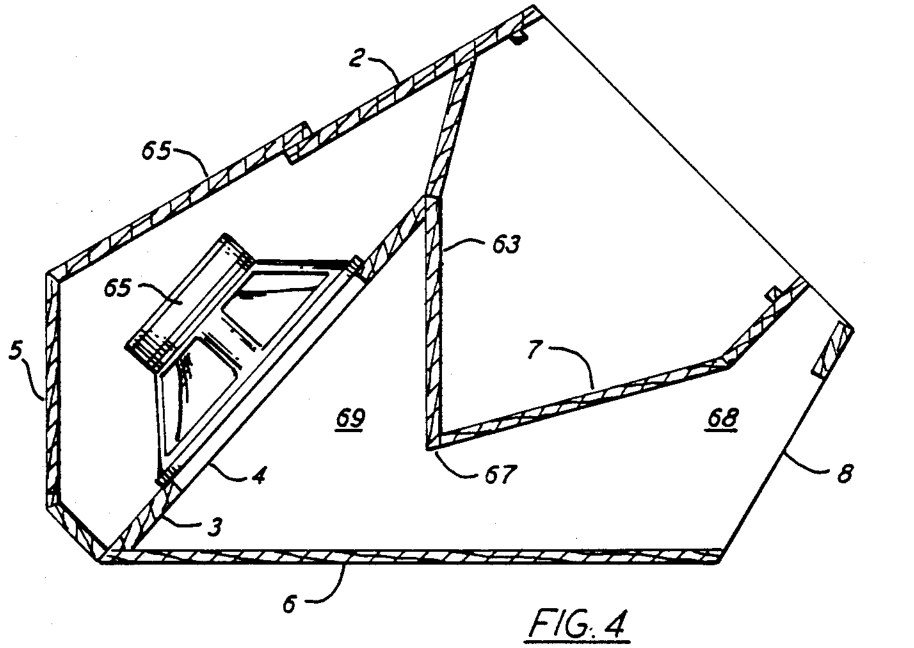
FIG. 4 longitudinal section of FIG.3, with a loudspeaker internally.

Referring to FIG.4 it will be seen that internal partition 3 serves as a mounting surface for a second 15" loudspeaker 65 (here illustrated as an Electrovoice EVM15B) which radiates downward through pass hole 4 into the volume 69 formed between partition 3 and enclosure bottom 6. Port 8 provides an outlet for the acoustic output of loudspeaker 65. Partition 63 separates the compartments for loudspeaker 75 and loudspeaker 65, each of which form an acoustically closed chamber for loading the rear of the drivers.

While a more conventional front (or rear) loading arrangement can be used to couple the acoustic output of the second loudspeaker 65 to free air via the duct, preferably the improved technique disclosed in U.S. Pat. No. Re:32,183 is employed. The partitions 3 and 7 which form the duct are installed so as to produce the required first volume 69 of progressively decreasing crosssection, a restricting throat 67, and a second volume 68 of progressively increasing cross-section terminating in a port 8 to free air. In addition to the unique benefits in efficiency, projection, and absence of undesirable coloration which attend the use of this technique, the resulting duct shape serves to minimize the height of the enclosure by minimizing the thickness of the duct in the same region where maximum depth is required by the forwardly-radiating drivers.

While the duct could be placed on any side of the enclosure, its location on the bottom has the added advantage of coupling low frequencies to the floor on which the enclosure sits, producing further efficiency gains.

In contrast to prior art infinite baffle and ported enclosures that place dual loudspeakers in a side-by-side arrangement doubling the frontal area of the enclosure, the enclosure illustrated in FIG. 1-5 locates the second loudspeaker internally, behind the forwardly-radiating drivers and on a common longitudinal plane, and couples the acoustic output of the former to free air by means of a duct extending parallel to one outer surface of the enclosure. The resulting enclosure presents one half the frontal area, with a minimal increase in crossection, as well as improving both the efficiency and projection of the second loudspeaker over prior art infinite baffle designs.

The illustrated embodiment employs a passive crossover between loudspeaker 75 and compression driver 10 at or above 2400Hz and an active crossover between them and loudspeaker 65 at approximately 100–150Hz. Other crossover points and arrangements can be employed.

In sum, the disclosed improved design techniques for loudspeaker enclosures generally, applied to the monitor enclosure illustrated in the Figures, allow the mounting of the same drivers in an enclosure with an unprecedented reduction in both frontal area and total volume, while markedly reducing spill, improving projection, and increasing both efficiency and intelligibility. These techniques allow the use of stock drivers and add little to the cost of the enclosure itself.

While one embodiment is illustrated, variations within the spirit of the invention will be apparent to those of skill in the art, and should not be understood as limited except by the claims.

These techniques may be applied individually or in combination. While their advantages are described in the context of monitor enclosures it will be apparent that they may be applied to sound reinforcement enclosures more generally to decrease the frontal area and volume of an enclosure while improving efficiency, projection, and intelligibility. One application is enclosures for permanent installations in existing ornamental interiors, and another temporary installations for concerts, stage plays, and television performances; both of which place a premium on minimizing the frontal area of the enclosures.

What is claimed is:

1. A sound projection assembly comprising a housing defining a longitudinally extending channel enclosing a free space, said channel having an acoustically open front end and an acoustically closed rear end and acoustically closed sides; a loudspeaker having a centerdriven cone diaphragm, said cone diaphragm defining a substantially frustoconical shape thereby defining a substantially frustoconical volume and operating into the channel at the rear end of said channel; and a coaxial longitudinally extending member within the channel directly in front of the loudspeaker to restrict the free space within the channel, said member having a longitudinal axis and further having exterior sides, said exterior sides and said acoustically closed sides of said housing defining an annular region extending from said volume to said acoustically open front end, said channel increasing in cross-sectional area toward said open front end, said member having a rear portion, which is tapered towards said loudspeaker and projects into said volume, said member further including at least one coaxial longitudinally extending passageway, said passageway increasing in cross-sectional area toward said open front end and extending between said volume and said acoustically open front end, said passageway opening rearwardly centrally into said volume along the longitudinal axis of said member.

2. The sound projection apparatus according to claim 1, wherein said rear portion is of part frustoconical shape.

3. The sound projection apparatus according to claim 1 or 2, a distance between said loudspeaker cone diaphragm and a surface of the rear portion of said longitudinally extending member increasing in a direction parallel to a longitudinal direction of said longitudinally extending member along the free space defined by said cone diaphragm and said rear portion of said longitudinally extending member.

4. The sound projection apparatus according to claim 1, said member having a front portion, which is tapered towards said acoustically open front end of said channel.

5. The sound projection apparatus according to claim 4, wherein said member tapers more abruptly towards said loudspeaker than towards said acoustically open front end of said channel.

6. The sound projection apparatus according to claim 5, said front portion of said member beginning to taper toward said acoustically open front end of said channel at a point substantially forward of a forward edge of said cone diaphragm.

7. The sound projection apparatus according to claim 5 or 6, a section of said annular region defined between said exterior sides of said member and said acoustically closed sides of said housing defining said channel being of substantially constant cross-sectional area immediately forward of a point where said rear portion of said member becomes more abruptly tapered toward said loudspeaker.

8. The sound projection apparatus according to claim 1, 2, 4 or 5, said loudspeaker having a magnet assembly including a coaxial central opening, said sound projection apparatus further including a high frequency compression driver having an outlet, said driver located coaxially and behind said magnet assembly, such that said outlet and said central opening are aligned.

9. The sound projection apparatus according to claim 8, and further including a horn flare coaxially mounted within said central opening of said magnet assembly and extending from said outlet to said volume defined by said center-driven cone diaphragm.

10. The sound projection apparatus according to claim 1 or 2, said loudspeaker having a voice coil form disposed centrally in said loudspeaker and said cone diaphragm having a minimum diameter at said voice coil form, said coaxial longitudinally extending passageway having a diameter at said rear portion of said member substantially greater than the minimum diameter of said cone diaphragm at said voice coil form.

11. The sound projection apparatus according to claim 5, said loudspeaker having a voice coil form disposed centrally in said loudspeaker and said cone diaphragm having a minimum diameter at said voice coil form, said coaxial longitudinally extending passageway having a diameter at said rear portion of said member substantially greater than the minimum diameter of said cone diaphragm at said voice coil form.

12. The sound projection apparatus according to claim 9, said loudspeaker having a voice coil from disposed centrally in said loudspeaker and said cone diaphragm having a minimum diameter at said voice coil form, said coaxial longitudinally extending passageway having a diameter at said rear portion of said member substantially greater than the minimum diameter of said cone diaphragm at said voice coil form.

* * * * *

UNITED STATES PATENT AND TRADEMARK OFFICE
CERTIFICATE OF CORRECTION

PATENT NO. : 4,836,327

DATED : June 6, 1989

INVENTOR(S) : ANDREWS, et al

It is certified that error appears in the above—identified patent and that said Letters Patent is hereby corrected as shown below:

Col. 3, line 33, after "FIG. 4", insert --is the--.

Col. 3, line 34, after "speaker" insert --installed--.

Col. 3, line 35, change "a" to --the--.

Col. 3, line 36, after "improved" insert --apparatus--.

Col. 3, line 38, after "of" insert --the present--.

Col. 3, line 38, change "me" to --member--.

Signed and Sealed this

Seventh Day of August, 1990

*Attest:*

HARRY F. MANBECK, JR.

*Attesting Officer*

*Commissioner of Patents and Trademarks*